US006381192B1

(12) United States Patent
Ahn et al.

(10) Patent No.: US 6,381,192 B1
(45) Date of Patent: Apr. 30, 2002

(54) ADDRESS BUFFER IN A FLASH MEMORY

(75) Inventors: Byung Jin Ahn; Sheung Hee Park; Min Kyu Kim; Jong Woo Kim, all of Seoul (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,470

(22) Filed: Nov. 28, 2000

(30) Foreign Application Priority Data

Dec. 28, 1999 (KR) ............................................. 99-63954

(51) Int. Cl.⁷ ................................................. G11C 8/00
(52) U.S. Cl. ............................. 365/230.08; 365/230.01; 365/185.33; 365/185.23; 365/185.11; 365/185.12
(58) Field of Search ....................... 365/230.01, 185.11, 365/185.12, 185.23, 185.33, 230.08

(56) References Cited

U.S. PATENT DOCUMENTS 5,602,786 A * 2/1997 Pascucci et al. ............. 365/200
5,691,945 A * 11/1997 Liou et al. .................... 365/200

* cited by examiner

Primary Examiner—Viet Q. Nguyen
(74) Attorney, Agent, or Firm—Pennie & Edmonds LLP

(57) ABSTRACT

An address buffer in a flash memory includes a buffer section for buffering external addresses to select specific sectors in the flash memory, a code storage section for storing a code to select a memory sector in the flash memory, a setting section for outputting internal addresses IA17~IA17 selecting the memory sector, by using the code outputted from the code storage section and sector select addresses among the external addresses.

22 Claims, 3 Drawing Sheets

ADDRESS BUFFER IN A FLASH MEMORY

FIELD OF THE INVENTION

The invention relates generally to a flash memory device, and more particularly to, an address buffer in a flash memory into which a flash cell is inserted, capable of selecting specific sectors in a high integrated core product.

BACKGROUND OF THE INVENTION

In general, unlike a general DRAM or SRAM, a flash memory requires a product strategy to satisfy various market needs of flexible manufacturing system. It can be accomplished through product development in a short period of time. To meet this market need, the conventional method of developing a flash memory is to manufacture a low cost product by verifying the technology through a core product and then acquiring an additional development schedule.

As shown in FIG. 1, in the conventional address buffer, the address terminals A0~A18 externally inputted for programming or erase are connected to one ends of the NAND gates NA0~NA18, respectively. Then, the input ends on the other ends of the NAND gates NA0~NA18 are connected to each other and are then connected to the output ends of the inverter 10 that is connected to the output terminal of the chip enable /CE. Also, the output ends of the NAND gates NA0~NA18 are each connected to the inverters NT0~NT18, wherein the outputs ends of respective inverters NT0~NT18 are connected to an internal circuit to output an internal address IA0~IA18.

The operation of the conventional address buffer will be now explained below.

The addresses A0~A18 externally inputted are each connected to one ends of the NAND gates. Also, the chip enable /CE is inputted to the inverter 10. Accordingly, if a LOW signal is inputted to the chip enable /CE, the inverter 10 outputs HIGH signals to the other input ends of the NAND gates NA0~NA18, respectively.

Each of the NAND gates NA0~NA18 the output ends of which are connected the inverter performs the same operation with the AND gates. Thus, if the above-mentioned the chip enable /CE is at LOW signal, respective NAND gates operates depending on the addresses A0~A18 which are inputted to one ends of the NAND gates. That is, if the address A0 is at HIGH signal, the NAND gate NA0 output a LOW signal. Therefore, the inverter NT0 outputs a HIGH signal. Also, if the address A0 is at LOW signal, the NAND gate NA0 outputs a HIGH signal and the inverter NT0 outputs a LOW signal. In other words, if the chip enable /CE is at LOW signal, the address buffer transfers the addresses A0~A18 to the internal addresses IA0~IA18 intact.

However, conventionally, if any of sectors in the memory block is damaged as a result of testing a completed memory, the damaged memory itself must be discarded. Due to this, there are problems that the throughput in the process is degraded and the const of the product is increased.

SUMMARY OF THE INVENTION

It is therefore an object of the present invention to provide an address buffer in a flash memory including a non-volatile sector select code cell by which a given sector can be selected in order to use a normal sector, by disabling a memory sector having defects generated in a high integrated corer product.

In order to accomplish the above object, an address buffer in a flash memory according to the present invention is characterized in that it includes a buffer section for buffering external addresses; a code storage section for storing a code to select a memory sector in the flash memory; and a setting section for outputting internal addresses selecting said memory sector, by using the code outputted from said code storage section and sector select addresses among said external addresses.

The buffer section comprises a plurality of NAND gates to one end of which is input said external address and to the other end of which is input an inverted chip enable signal; and a plurality of inverters each connected to the output ends of said NAND gates, respectively.

The code storage section comprises first and second flash cells for storing codes selecting the memory sector, depending on program/erase state.

The setting section comprises a first PMOS transistor and a third PMOS transistor to the gate of which is inputted a chip enable signal; a second PMOS transistor connected between said first PMOS transistor and a first flash cell ; a fourth PMOS transistor connected between said third PMOS transistor and a second flash cell; first and second inverters connected between said fourth PMOS transistor and said second flash cell; first and second transmission gates that are turned on and off by means of the output signal from said first and second inverters; third and fourth inverters connected between said second PMOS transistor and said first flash cell; a third transmission gate that is turned on and off by means of the output signal from said fourth inverter; and a NAND gate one end of which inputs the signal passed through said second transmission gate and the other input end of which inputs the output signal from said third inverter to thus output the internal address.

The first transmission gate outputs the output signal of any one of the inverters to the internal address. The third transmission gate is turned on and off depending on the output signal of said fourth inverter to thus connect the output ends of said first transmission gate and said second transmission gate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
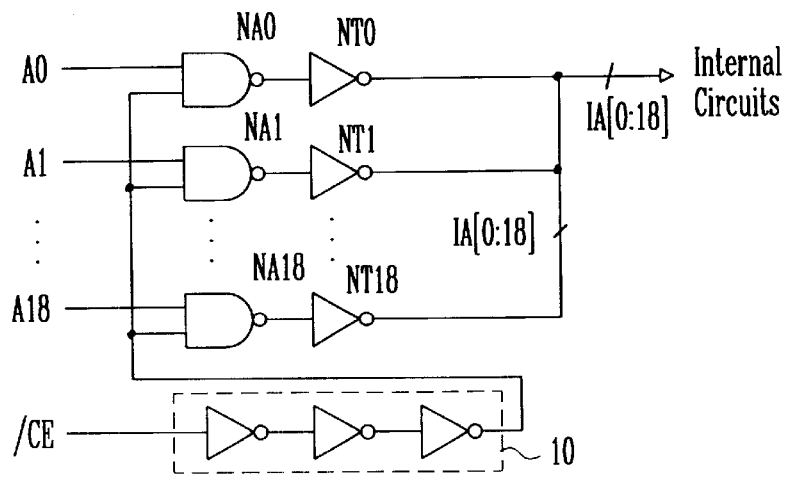
FIG. 1 is an address buffer and a simplified buffer circuit in a conventional flash memory.
Figure 2:
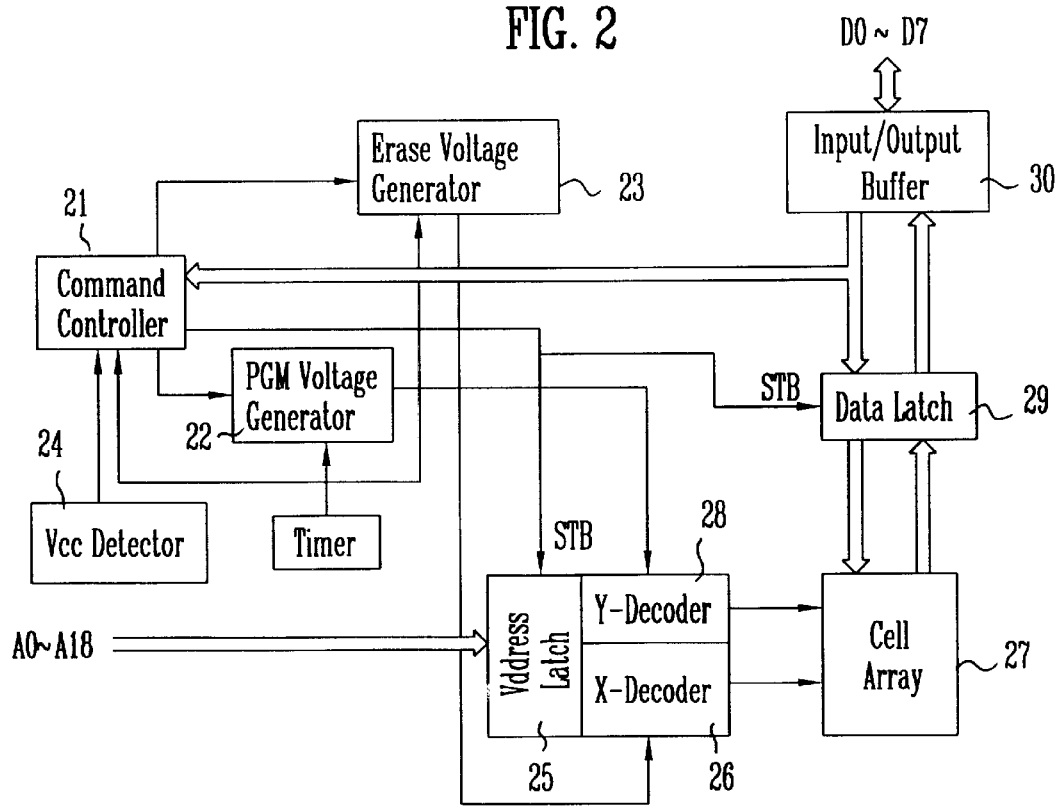
FIG. 2 is a block diagram of a flash memory according to the present invention.
Figure 3:
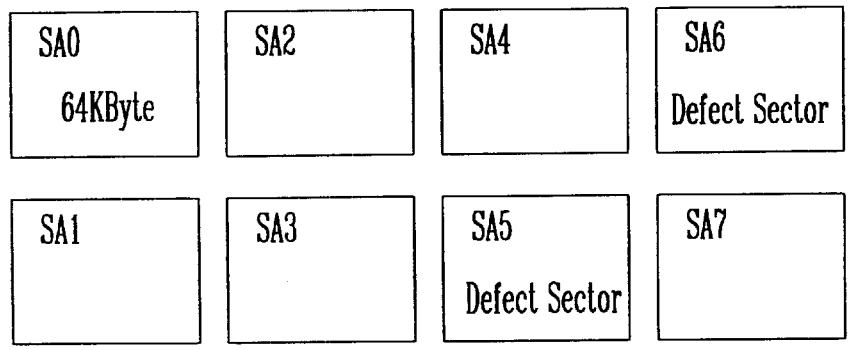
FIG. 3 shows the construction of sectors in a flash memory according to the present invention.

FIG. 2 is a block diagram of a flash memory according to the present invention. The flash memory mainly comprises a command latch for latching commands inputted through an input/output buffer 30 functioning as an interface between the system and the flash chip; a command controller 21 comprises a command decoder for generating signals necessary for various mode (erase, programming, verification, read); a program voltage generator 22 and an erase voltage generator 23, which comprises a high voltage switch circuit and a voltage driver circuit, for generating a high voltage necessary to perform the erase and programming mode; a power supply voltage detector 24 for detecting a power supply voltage (Vcc); an address latch 25 for latching an address; a X decoder 26; a Y decoder 28; a cell array 27 and a data latch 29 for latching data inputted through the buffer into a latch state using a latch control signal. The flash memory further includes address lines for randomly accessing memory information, a data line for outputting data and a control line for selecting a chip and specifying a write mode The flash memory according to an embodiment of the present invention is a 4 Mb flash memory, as shown in FIG. 3. The 4 Mb flash memory comprises eight (8) unit sectors SA0~SA7 formed of 64 Kilobyte size.

The 4 Mb flash memory has nineteen (19) addresses A0~A18 for inputting/outputting data to the eight unit sectors. Among them, the addresses A16~A18 are sector select addresses for selecting given sectors.

The relationship between each of the above-mentioned sector select addresses and each of the eight sectors is shown in Table 1. Referring to Table 1, if the address A18 becomes a LOW state, the sectors SA4~SA7 are disabled. Therefore, 2 Mb in the flash memory of 4 Mb can be used.

TABLE 1

Mapping From Sector Select Address bits to Sectors

| Sector | A18 | A17 | A16 | Address range |
|---|---|---|---|---|
| SA0 | 0 | 0 | 0 | 00000h–0FFFFh |
| SA1 | 0 | 0 | 1 | 10000h–1FFFFh |
| SA2 | 0 | 1 | 0 | 20000h–2FFFFh |
| SA3 | 0 | 1 | 1 | 30000h–3FFFFh |
| SA4 | 1 | 0 | 0 | 40000h–4FFFFh |
| SA5 | 1 | 0 | 1 | 50000h–5FFFFh |
| SA6 | 1 | 1 | 0 | 60000h–6FFFFh |
| SA7 | 1 | 1 | 1 | 70000h–7FFFFh |

Wherein SA0~SA7: unit sector having the size of 64 Kilobyte,

A16~A18: sector select addresses, and

Address range: address range of respective unit sector consisted of the addresses A0~A15.

Figure 4:
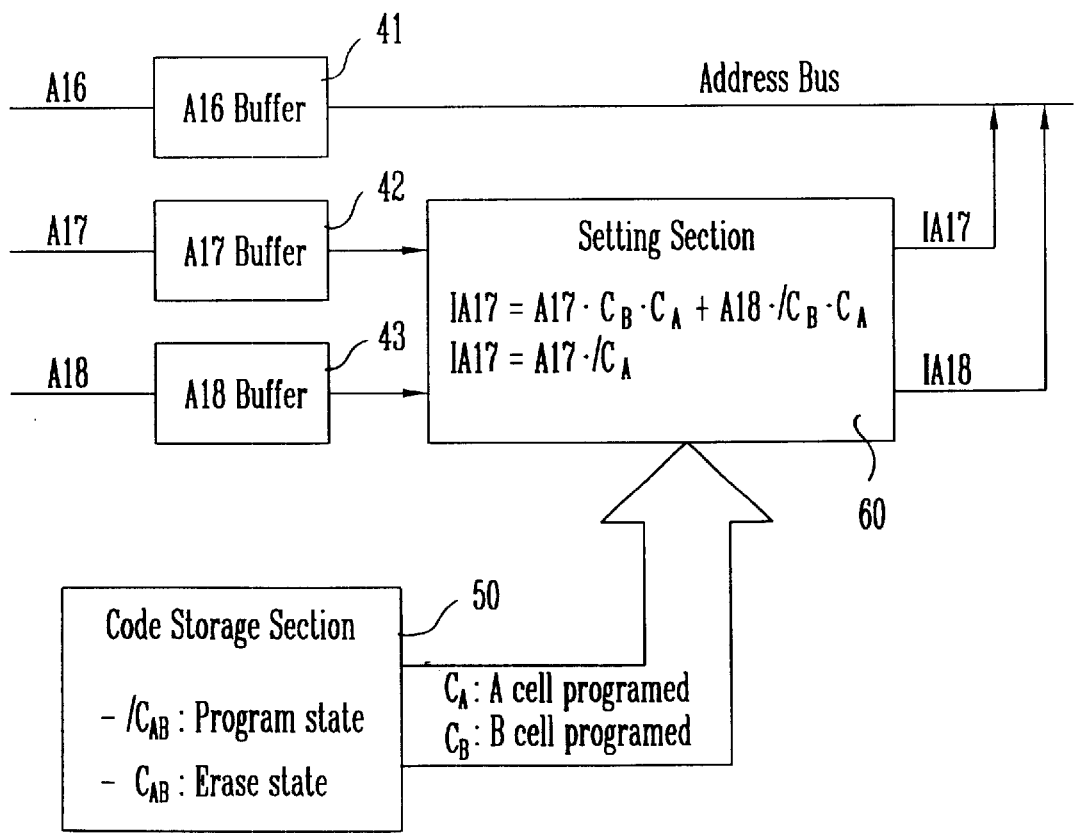
FIG. 4 is a block diagram showing an address buffer according to the present invention.

Meanwhile, as shown in FIG. 4, the address buffer circuit in the above-mentioned flash memory is mainly consisted of a buffer section, a code storage section and a setting section, which are explained in detail below.

The address buffer functions to temporarily store addresses (only the addresses A16~A18 are shown for convenience) externally inputted and then to output them to the internal addresses IA0~IA17. The address buffer circuit include a setting section 60 for setting internal addresses IA17 and IA18 by computing the outputs of an address A17 buffer 42 and an address A18 buffer 43 and the output of the address storage section 50, in order to select a given sector using a first flash cell A and a second flash cell B.

The above-mentioned code storage section 50 outputs codes corresponding to a CA signal and a /CA signal each for programming and erasing a code address memory A cell (referred to as 'A cell' below), and a CB signal and a /CB signal each for programming and erasing a code address memory B cell (referred to as 'B cell' below). Also, the setting section 60 sets the state of the internal addresses IA17 and IA18 depending on the codes outputted from the addresses A17 and A18 and the code storage section 50. That is, the internal addresses IA17 and IA18 are set by the relationship: IA17=A17·CB·CA+A18·/CB·CA, IA18=A18·/CA.

For example, in a 4 Mb flash memory having eight sectors SA0~SA7, if any defects are found in the sectors SA5 and SA6, the entire memory could not be used. However, if the internal address IA18 is disabled, the 4 Mb flash memory can be used as a 2 Mb flash memory.

Figure 5:
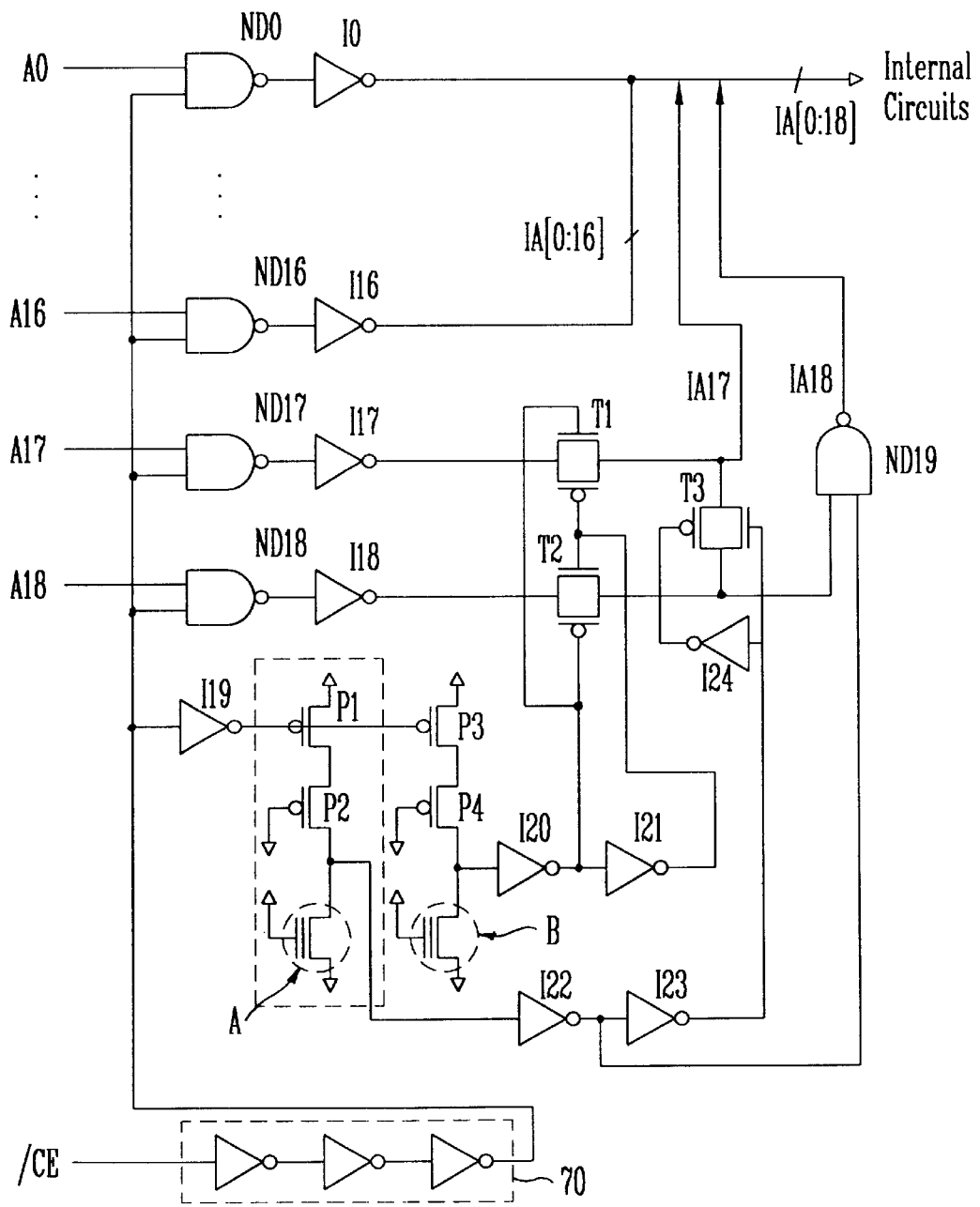
FIG. 5 is an embodiment of an address buffer circuit according to the present invention.

Referring now to FIG. 5, the above-mentioned address buffer circuit will be below explained in detail. The address buffer mainly comprises the buffer section, the code storage section and the setting section, as mentioned above.

The chip enable /CE signal is inputted to the inverter chain 70, the output end of which is connected to the other input ends of the NAND gates ND0~ND18, respectively. One ends of the NAND gates ND0~ND18 input the addresses A0~A18 externally inputted for the programming or the erase.

Respective output ends of the NAND gates ND0~ND18 are connected to the input ends of the inverters I1~I19 while the output ends of the inverters I1~I17 are connected to the internal circuit, thus becoming internal addresses IA0~IA16.

Meanwhile, the output end of the inverter chain 70 is connected to the input end of the to inverter I1 and is also connected to the input end of the inverter chain I19, and the output end of the inverter I19 is the gates of the first PMOS transistor P1 and the third PMOS transistor P3. The first PMOS transistor P1 is connected to the first flash cell A of the second PMOS transistor P2 and the third PMOS transistor P3 is connected to the fourth PMOS transistor P4 and the second flash cell B.

The connection point between the second PMOS transistor P2 and the first flash cell A is connected to the input end of the inverter I22, and the output end of the inverter I22 is connected to the input end of the inverter I23 and the other input end of the NAND gate ND19. Also, the output end of the inverter I23 is connected to the inverter I24 and the non-inverting gate of the third transmission gate T3, and the output end of the inverter I24 is connected to the 20 inverting gate of the third transmission gate T3.

The connection point between the fourth PMOS transistor P4 and the second flash cell B is connected to the input end of the inverter I20. Also, the output end of the inverter I20 is connected to the input end of the inverter I23, the non-inverting gate of the first transmission gate T1 and the inverting gate of the second transmission gate T2. The output end of the inverter I21 is connected to the inverting gate of the first transmission gate T1 and the non-inverting gate of the second transmission gate T2.

At this time, the above-mentioned inverter I17 outputs an internal address IA17 via the first transmission gate T1, the output end of the inverter I18 is connected to one end of the NAND gate ND19 via the second transmission gate T2 and the NAND gate ND19 outputs an internal address IA18.

The operation of the address buffer circuit will be below explained in detail.

The addresses A0~A18 externally inputted are each inputted to one end of the NAND gates ND0~ND18. Also, the chip enable signal /CE is connected to the other input end of the NAND gates ND0~ND18 and the input end of the inverter I19 via the inverter chain 70.

As each of the NAND gates ND0~ND18 to the output end of which is connected the inverters I0~I18 performs the same operations to the AND gate (AND gate), if the above-mentioned chip enable /CE is at LOW signal, the respective inverters I0~I18 output the addresses A0~A18 inputted thereto intact. That is, if the address A0 is at HIGH signal, the NAND gate ND0 outputs a LOW signal and the inverter I0 therefore outputs a HIGH signal. Also, if the address A0 is at LOW signal, the NAND gate ND0 outputs a HIGH signal and the inverter I0 therefore outputs a LOW signal.

The chip enable signal /CE of a LOW signal is converted into a HIGH signal via the inverter chain 70 and is inputted to the inverter I19. Also, the inverter I19 outputs a LOW signal. The LOW signal outputted from the inverter I19 turns on the first PMOS transistor P1 and the third PMOS transistor P3.

If the first flash cell A is programmed, a HIGH signal is inputted to the inverter I22, which thus outputs a LOW signal. Therefore, the NAND gate ND19 outputs IA18 of a HIGH signal regardless of the remaining inputs. Also, the inverter I23 outputs a HIGH signal and thus turns on the third transmission gate T3. However, if the second flash cell B is programmed, a HIGH signal is inputted to the inverter I20. Therefore, the inverter I20 outputs a LOW signal and the inverter I21 outputs a HIGH signal. Accordingly, the second transmission gate T2 is turned on and the output signal of the inverter I18 is thus outputted to the internal address IA17 via the third transmission gate T3. On the other hand, if the second flash cell B is not programmed, a LOW signal is inputted to the inverter I20. Therefore, the inverter I20 outputs a HIGH signal and the inverter I21 outputs a LOW signal. Accordingly, the first transmission gate T1 is turned on and the output signal of the inverter I17 is thus outputted to the internal address IA17 via the first transmission gate T1.

Meanwhile, if the first flash cell A is not programmed, a LOW signal is inputted to the inverter I22. Therefore, the inverter I22 outputs a HIGH signal to the input end of the inverter I23 and the other input end of the NAND gate ND19. Accordingly, the transmission gate T3 is turned off and the NAND gate ND19 outputs IA18 depending on the remaining inputs. At this time, if the second flash cell B is programmed, a HIGH signal is inputted to the inverter I20. Thus, the inverter I20 outputs a LOW signal and the inverter I21 outputs a HIGH signal. Accordingly, the second transmission gate T2 is turned on and the output signal of the inverter I18 is thus outputted to the other input end of the NAND gate ND19. Meanwhile, if the second flash cell B is not programmed, a LOW signal is inputted to the inverter I20. Therefore, the inverter I20 outputs a HIGH signal and the inverter I21 outputs a LOW signal. Accordingly, the first transmission gate T1 is turned on and the output signal of the inverter I17 is thus outputted to the internal address IA17 via the first transmission gate T1.

As can be understood from the above description, according to an address buffer in a flash memory, usable sectors can be selected through CAM cells using a practical flash cell. Thus, as the present invention has an option to select the usable sectors or disable the defect sectors, the manufacturing throughput can be improved. Also, as the present invention can perform the same process even after the package has finished, electronic coding can be accomplished.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A address buffer in a flash memory, comprises:
   a buffer section for buffering external addresses;
   a code storage section for storing a code to select a memory sector in the flash memory; and
   a setting section for outputting internal addresses selecting said memory sector, by using the code outputted from said code storage section and sector select addresses included among said external addresses, wherein said buffer section comprises:
      a plurality of NAND gates each having as inputs one of said external addresses and an output from an inverted chip enable signal; and
      a plurality of inverters each having as an input, an output of one of said NAND gates.

2. The address buffer in a flash memory according to claim 1 wherein said code storage section comprises first and second flash cells for storing codes selecting said memory sector, depending on whether the flash memory is in a program state or in an erase state.

3. A address buffer in a flash memory, comprises:
   a buffer section for buffering external addresses;
   code storage section for storage a code to select a memory sector in the flash memory; and
   a setting section for outputting internal addresses selecting said memory sector, by using the code outputted from said code storage section and select addresses included among said external addresses, wherein said settings comprises:
      a first PMOS transistor and a third PMOS transistor to the gate of which is inputted a chip enable signal;
      a second PMOS transistor connected between said first PMOS transistor and a first flash cell;
      a fourth PMOS transistor connected between said third PMOS transistor and a second flash cell;
      first and second inverters connected together in series, with the inverter receiving an input from a node common to the fourth PMOS transistor and said second flash cell;
      first and second transmission gates controlled by output signals from said first and second inverters;
      third and fourth inverters connected together in series, with the third inverter receiving an input from a node common to the second PMOS transistor and said first flash cell;
      a third transmission gate controlled by an output signal from said fourth inverter; and
      a NAND gate having as a first input a signal passed through said second transmission gate, and having as a second input an output signal from said third inverter, the NAND gate thereby outputting an internal address.

4. The address buffer in a flash memory according to claim 3, wherein only one of said first and second transmission gates are on at any one time.

5. The address buffer in a flash memory according to claim 3, wherein said third transmission gate is turned on and off depending on an output signal of said fourth inverter, the third transmission gate connecting output ends of said first transmission gate and said second transmission gate, when the third transmission gate is on.

6. A flash memory device having therein an address buffer comprising:
   a buffer section for buffering external addresses;
   a code storage section for storing a code to select a memory sector in the flash memory device; and a setting section for outputting internal addresses selecting said memory sector, by using the code outputted from said code storage section and sector select addresses included among said external addresses, wherein said buffer section comprises:
  a plurality of NAND gates each having as inputs one of said external addresses and an output from an inverted chip enable signal; and
  a plurality of inverters each having as an input, an output of one of said NAND gates.

7. The flash memory device according to claim 6, wherein said code storage section comprises first and second flash cells for storing codes selecting said memory sector, depending on whether the flash memory is in a program state or in an erase state.

8. A flash memory device having therein an address buffer comprising:
  a buffer section for buffering external addresses;
  a code storage section for storing a code to select a memory sector in the flash memory device; and
  a setting section for outputting internal addresses selecting said memory sector, by using the code outputted from said code storage section and sector select addresses included among said external addresses, wherein said setting section comprises:
    a first PMOS transistor and a third PMOS transistor to the gate of which is inputted a chip enable signal;
    a second PMOS transistor connected between said first PMOS transistor and a first flash cell;
    a fourth PMOS transistor connected between said third PMOS transistor and a second flash cell;
    first and second inverters connected together in series, with the first inverter receiving an input from a node common to the fourth PMOS transistor and said second flash cell;
    first and second transmission gates controlled by output signals from said first and second inverters;
    third and fourth inverters connected together in series, with the third inverter receiving an input from a node common to the second PMOS transistor and said first flash cell;
    a third transmission gate controlled by an output signal from said fourth inverter; and
    a NAND gate having as a first input a signal passed through said second transmission gate, and having as a second input an output signal from said third inverter, the NAND gate thereby outputting an internal address.

9. The flash memory device according to claim 8, wherein only one of said first and second transmission gates are on at any one time.

10. The flash memory device according to claim 8, wherein said third transmission gate is turned on and off depending on an output signal of said fourth inverter, the third transmission gate connecting output ends of said first transmission gate and said second transmission gate, when the third transmission gate is on.

11. An address buffer for a flash memory having a plurality of sectors divided into two groups, the address buffer comprising:
  a buffer section for buffering external addresses and creating at least one internal address having a most significant bit used to select from among said two groups;
  a code storage section for storing at least two codes; and
  a setting section responsive to codes from the code storage section, the setting section configured to:
    set said most significant bit, if none of said plurality of sectors has failed; and
    disable said most significant bit, if at least one of said plurality of sectors has failed.

12. The address buffer in a flash memory according to claim 11, wherein said buffer section comprises:
  a plurality of NAND gates each having as inputs one of said external addresses and an output from an inverted chip enable signal; and
  a plurality of inverters each having as an input, an output of one of said NAND gates.

13. The address buffer in a flash memory according to claim 11, wherein said code storage section comprises first and second flash cells for storing said codes and for disabling the most significant bit depending on whether at least one of the sectors has failed.

14. The address buffer in a flash memory according to claim 11, wherein said setting section comprises:
  a first PMOS transistor and a third PMOS transistor to the gate of which is inputted a chip enable signal;
  a second PMOS transistor connected between said first PMOS transistor and a first flash cell;
  a fourth PMOS transistor connected between said third PMOS transistor and a second flash cell;
  first and second inverters connected together in series, with the first inverter receiving an input from a node common to the fourth PMOS transistor and said second flash cell;
  first and second transmission gates controlled by output signals from said first and second inverters;
  third and fourth inverters connected together in series, with the third inverter receiving an input from a node common to the second PMOS transistor and said first flash cell;
  a third transmission gate controlled by an output signal from said fourth inverter; and
  a NAND gate having as a first input a signal passed through said second transmission gate, and having as a second input an output signal from said third inverter, the NAND gate thereby outputting an internal address.

15. The address buffer in a flash memory according to claim 14, wherein only one of said first and second transmission gates are on at any one time.

16. The address buffer in a flash memory according to claim 14, wherein said third transmission gate is turned on and off depending on an output signal of said fourth inverter, the third transmission gate connecting output ends of said first transmission gate and said second transmission gate, when the third transmission gate is on.

17. A flash memory device having a plurality of sectors which are divided into two groups, the flash memory device having an address buffer comprising:
  a buffer section for buffering external addresses and creating at least one internal address having a most significant bit used to select from among said two groups;
  a code storage section for storing at least two codes; and
  a setting section responsive to codes from the code storage section, the setting section configured to:
    set said most significant bit, if none of said plurality of sectors has failed; and
    disable said most significant bit, if at least one of said plurality of sectors has failed.

18. The flash memory device according to claim 17, wherein said buffer section comprises:

a plurality of NAND gates each having as inputs one of said external addresses and an output from an inverted chip enable signal; and a plurality of inverters each having as an input, an output of one of said NAND gates.

19. The flash memory device according to claim 17, wherein said code storage section comprises first and second flash cells for storing codes selecting said memory sector, depending on whether the flash memory is in a program state or in an erase state.

20. The flash memory device according to claim 17, wherein said setting section comprises:

a first PMOS transistor and a third PMOS transistor to the gate of which is inputted a chip enable signal;

a second PMOS transistor connected between said first PMOS transistor and a first flash cell;

a fourth PMOS transistor connected between said third PMOS transistor and a second flash cell;

first and second inverters connected together in series, with the first inverter receiving an input from a node common to the fourth PMOS transistor and said second flash cell;

first and second transmission gates controlled by output signals from said first and second inverters;

third and fourth inverters connected together in series, with the third inverter receiving an input from a node common to the second PMOS transistor and said first flash cell;

a third transmission gate controlled by an output signal from said fourth inverter; and a NAND gate having as a first input a signal passed through said second transmission gate, and having as a second input an output signal from said third inverter, the NAND gate thereby outputting an internal address.

21. The flash memory device according to claim 20, wherein only one of said first and second transmission gates are on at any one time.

22. The flash memory device according to claim 20, wherein said third transmission gate is turned on and off depending on an output signal of said fourth inverter, the third transmission gate connecting output ends of said first transmission gate and said second transmission gate, when the third transmission gate is on.

* * * * *